(12) United States Patent
Broillet

(10) Patent No.: US 9,500,668 B2
(45) Date of Patent: Nov. 22, 2016

(54) MEASURING CIRCUIT FOR MONITORING AND TESTING FUNCTIONALITY OF A MEASURING CHAIN

(71) Applicant: Bernard Broillet, Misery (CH)

(72) Inventor: Bernard Broillet, Misery (CH)

(73) Assignee: MEGGITT SA (CH)

( * ) Notice: Subject to any disclaimer, the term of this patent is extended or adjusted under 35 U.S.C. 154(b) by 194 days.

(21) Appl. No.: 14/152,349

(22) Filed: Jan. 10, 2014

(65) Prior Publication Data

US 2014/0225634 A1    Aug. 14, 2014

(30) Foreign Application Priority Data

Feb. 14, 2013   (EP) .................................... 13155244

(51) Int. Cl.
| | |
|---|---|
| G01P 21/00 | (2006.01) |
| G01H 1/08 | (2006.01) |
| H04B 3/46 | (2015.01) |
| G01L 27/00 | (2006.01) |
| G01R 31/28 | (2006.01) |

(52) U.S. Cl.
CPC .............. G01P 21/00 (2013.01); G01H 1/08 (2013.01); G01L 27/002 (2013.01); H04B 3/46 (2013.01); G01R 31/2829 (2013.01)

(58) Field of Classification Search
None
See application file for complete search history.

(56) References Cited

U.S. PATENT DOCUMENTS

| | | | | |
|---|---|---|---|---|
| 3,992,665 | A | * | 11/1976 | Preikschat ........... G01N 27/041 324/666 |
| 6,498,501 | B2 | | 12/2002 | Broillet |
| 2002/0008527 | A1 | * | 1/2002 | Broillet .................. G01H 11/08 324/727 |
| 2004/0194532 | A1 | | 10/2004 | Lally et al. |
| 2013/0093434 | A1 | * | 4/2013 | Peyton .................... H04M 3/34 324/628 |

FOREIGN PATENT DOCUMENTS

| | | |
|---|---|---|
| CH | 658 908 A5 | 12/1986 |
| EP | 0 525 549 A2 | 2/1993 |
| EP | 0 689 055 A1 | 12/1995 |

OTHER PUBLICATIONS

European Search Report dated Oct. 17, 2013 issued in corresponding European patent application No. EP 13 15 5244.

* cited by examiner

*Primary Examiner* — Jermele M Hollington
*Assistant Examiner* — Douglas X Rodriguez
(74) *Attorney, Agent, or Firm* — Ostrolenk Faber LLP

(57) ABSTRACT

A measuring circuit which includes an evaluation circuit (13, 63); a sensing circuit (39, 40) having a sensing element (6, 55) configured to generate a measuring signal from a measuring object (7) and a transmission line (26, 69) for transmitting the measuring signal to the evaluation circuit (13, 63); and a test signal injection circuit (21) including a signal injector (12) and an injection line (20) connecting a signal output of the signal injector (12) with the sensing circuit (39, 40) for feeding a test signal into the sensing circuit (39, 40) such that the test signal is transmittable to the evaluation circuit (13, 63) over the transmission line (26, 69). The injection line (20) and the transmission line (26, 69) are advantageously interconnected in series via the sensing element (6, 55) such that the test signal can be fed through the sensing element (6, 55).

17 Claims, 3 Drawing Sheets

MEASURING CIRCUIT FOR MONITORING AND TESTING FUNCTIONALITY OF A MEASURING CHAIN

TECHNICAL FIELD OF THE INVENTION

The present invention relates to a measuring circuit comprising
an evaluation circuit;
a sensing circuit comprising a sensing element configured to generate a measuring signal from a measuring object and a transmission line for transmitting the measuring signal to the evaluation circuit; and
a test signal injection circuit comprising a signal injector and an injection line connecting a signal output of the signal injector with the sensing circuit for feeding a test signal into the sensing circuit such that the test signal is transmittable to the evaluation circuit over the transmission line.

BACKGROUND OF THE INVENTION

Such a measuring circuit can be employed, for instance, to detect vibrations. In particular, the measuring object can be constituted by a rotary machine, such as an engine of an airplane or a land based turbine such as a gas or steam turbine, or any other vibrating structure.

A measuring circuit of that type is known from U.S. Pat. No. 6,498,501 B2. The sensing element of this circuit is provided by a piezoelectric transducer. The sensing circuit further comprises two injection capacitors connected in parallel to the piezoelectric transducer. Both injection capacitors are connected to the injection line such that the auxiliary test signal can be injected from the output of the signal injector into the sensing circuit by means of the signal injection capacitors. The test signal is then transmitted from the injection points to the evaluation circuit via a respective transmission line. This enables the measuring circuit to evaluate the quality of the measuring circuit not only during operation of the monitored vibration machine but also when the vibration machine is at rest. In this way, a permanent surveillance of the measuring circuit can be achieved.

A disadvantage of this measuring circuit is that its internal built-in test equipment (BITE) is limited to the monitoring of a proper functioning of the transmission lines and of a proper connectivity to external components, since only those are employed to deliver the test signal to the evaluation circuit. But the sensing element itself cannot be tested as the auxiliary test signal is passed around the terminals of the sensing element by the signal injection capacitors. The quality of the sensing element, however, is of crucial importance for the reliability of the measuring circuit.

Another disadvantage is the need of provision of signal injection capacitors. In general, such additional components of a desired high reliability lead to increased production costs. On the other hand, additional components have intrinsically a certain probability of failure and will therefore contribute to possible sources of error in the measuring circuit.

It is an object of the present invention to remedy at least one of the above mentioned disadvantages and to provide the initially addressed measuring circuit with an improved BITE functionality. In particular, possible sources of error existing in current measuring circuits shall be made better identifiable or reduced or eliminated by the newly proposed circuit design according to the invention.

SUMMARY OF THE INVENTION

At least one of these objects is achieved by the measuring circuit according to claim 1. The dependent claims define preferred embodiments.

Accordingly, the invention suggests that the injection line and the transmission line are interconnected in series via the sensing element such that the test signal can be fed through the sensing element. In this way, the functionality of the measuring circuit can be extended to a monitoring and/or testing of the functionality of the sensing element, in addition to the monitoring and/or testing of the transmission line and of the connectivity of the measuring circuit. Thus, possible error sources related to the sensing element can be made identifiable.

Moreover, by feeding the test signal directly through the sensing element, the provision of additional injection capacitors can be omitted. Thus, possible error sources related to the functionality of the injection capacitors can be eliminated. In addition, the complexity of the overall measuring circuit can be decreased leading to a more reliable and economical circuit design.

Preferably, the injection line and the transmission line are separate from each other except their series connection via the sensing element. Thus, the test signal can preferably be fed into the transmission line only through the sensing element. Preferably, the only physical connection in between the transmission line and the signal injector is thus provided via the sensing element. This can contribute to an unambiguous verifiability of quality factors that are related to the sensing element.

Preferably, at least one of the following configurations of the test signal injection circuit is applied to provide a suitable test signal via the injection line:

The signal injector is preferably connected to ground. The injection line is preferably connected to ground, in particular via the signal injector. This can be exploited to transmit the test signal in parallel to a capacitance that is inherently present along the injection line. The test signal preferably corresponds to the difference in electric potential between the grounded injection line and the signal generator. Preferably, a feeding pole for the test signal on the sensing element is thus connected to ground via the injection line and the signal injector. In this way, an advantageous injection of the test signal in the sensing circuit and an according transmission to the evaluation circuit can be accomplished.

Further to this purpose, the signal injector is preferably configured to provide the test signal with a low output impedance. In particular, the signal output of the signal injector preferably has an ohmic impedance value of at most 10 □, more preferred at most 0.5 □. As a result, a test signal is preferably obtained that corresponds to the difference in electric potential between the grounded injection line and the signal generator of low ohmic impedance. Such a test signal of low ohmic impedance is preferably generated in order to match its value to the impedance value of the sensing element. In particular, the impedance of the sensing element may be very low in case of a failure and/or quality loss of the sensing element.

According to a preferred configuration, the signal injector comprises a signal generator and a transformer for the generated signal. A primary winding of the transformer is preferably connected to the signal amplifier. A secondary winding of the transformer is preferably connected to the injection line. In particular, the secondary winding is preferably connected to ground.

The transformer is preferably applied to match the impedance value of the signal output of the signal injector to a desired value, in particular to an impedance value as indicated above. Preferably, the inductance of the secondary winding of the transformer connected to the injection line matches the desired impedance value. According to another preferred configuration, the signal injector is constituted by a signal generator exhibiting the desired impedance value.

Preferably, the signal injector is adapted to generate a charge at a feeding pole of the sensing element by means of the test signal transmitted via the injection line. Preferably, the test signal provided by the signal injector comprises an alternative voltage. More preferred, the test signal comprises a frequency outside a predetermined frequency range corresponding to a frequency band of measuring signals that can be generated or that are envisaged to be generated by the sensing element. Alternatively or additionally, the test signal may comprise a direct current (DC) signal.

Preferably, the injection line and the transmission line or several transmission lines extend through a common enclosure, in particular a cable. The integration or partial integration of both the injection line and the transmission line or several transmission lines in the common enclosure can contribute to a more economical circuit design. The enclosure preferably constitutes a common electromagnetic shielding for the injection line and the transmission line or several transmission lines. The shielding can be applied to attenuate or eliminate external perturbations.

In consequence, however, an effective capacitance between the shielding and each of the conductors constituted by the injection line and each transmission line may be inherently present. The resulting capacitance seen between the signal injector and the evaluation circuit may therefore influence the transmitted signal to be evaluated in the evaluation circuit. Preferably, the shielding is connected to ground. In this way, an undesired participation of this resulting capacitance in a transfer function of the transmitted signal to be evaluated in the evaluation circuit can be effectively avoided.

Additionally, an effective capacitance between the conductors of the injection line and each transmission line may be inherently present. Each of these capacitances therefore may influence the injected signal and/or the transmitted signal to be evaluated in the evaluation circuit. Preferably, the injection line and/or at least one of the transmission lines solely extend through a separate enclosure, in particular a respective electromagnetic shielding to attenuate or eliminate external perturbations. Preferably, the separate shielding is connected to ground. In this way, a direct injection of the test signal into the effective capacitance in between the conductors of the injection line and the respective transmission line can be effectively eliminated. Thus, an undesired participation of the effective capacitance in a transfer function of the signal transmitted to the evaluation circuit can be avoided.

Preferably, a separate shielding is provided for the injection line and a separate shielding is provided for at least one transmission line or for several transmission lines altogether. More preferred, a separate electromagnetic shielding for the injection line and for each transmission line is provided. Each separate shielding is preferably connected to ground.

With respect to the above described common and/or separate shielding, different shielding concepts are conceivable: According to a first preferred configuration, only a separate shielding is provided for the injection line and/or the transmission line or transmission lines. According to a second preferred configuration, only a common shielding is applied through which the injection line and each of the transmission lines extend. According to a third and most preferred configuration, both a common shielding for the injection line and the at least one transmission line and a separate shielding for each of the injection line and the at least one transmission line inside the common electromagnetic shielding are provided. In this way, the measuring circuit can be adapted to a desired reliability of its measuring and testing functionality.

In particular, different shielding concepts may be applied depending on the length of a cable to be used for the injection line and/or transmission line or transmission lines. The longer the cable, the larger the number of respective electromagnetic shields is preferably applied. Besides an increasing immunity to electric fields, the testing sensitivity of variations of the capacitance of the sensing element can thus be improved.

Preferably, the sensing element and at least part of the injection line and/or transmission line are enclosed by a sensor housing. In this way, a sensor mountable in proximity or in a desired distance to the measuring object can be provided. Preferably, the evaluation circuit and/or the signal injector are arranged outside the housing to allow a compact design of the sensor.

Preferably, output passages are provided inside the walls of the sensor housing through which the injection line and/or the transmission line pass through. More preferred, the output passages are provided as output terminals in the sensor housing and respective connection wires are provided inside the housing to connect the sensing element with each of the output terminals. The external part of the injection line and/or each transmission line can preferably be plugged into the respective output terminals from outside the housing.

Preferably, the sensing element is electrically insulated from the walls of the sensor housing. Thus, the sensing element is preferably provided electrically floating inside the housing. Moreover, the injection line and/or the transmission line are preferably insulated from the walls of the sensor housing. In consequence, an effective capacitance between the housing and the sensing element and/or between the housing and the injection line and/or the transmission line may be inherently present. The sensor, in particular the sensor housing, is preferably connected to ground. Thus, an undesired participation of the effective capacitance in a transfer function of the transmitted signal to be evaluated in the evaluation circuit can be avoided.

Preferably, the sensing element is a piezoelectric sensing element. In particular, the sensing element preferably comprises a stack of piezoelectric plates. The measuring element made from such a piezoelectric member has the advantage of being well proved and tested in various intended application areas of the measuring circuit, in particular in the field of monitoring systems for vibrating and/or rotating engines, such as aircraft engines and/or gas turbines. It is understood that, in particular for certain applications, also another sensing element is conceivable, such as an inductive, capacitive, resistive or electro-optic measuring element. Preferably, the sensing element is a transducer, in particular a piezoelectric transducer.

Preferably, the sensing element comprises at least one feeding pole for injecting the test signal and at least one output pole for delivering the measuring signal and/or the test signal. Preferably, the poles are provided with an inverse polarity. The injection line is preferably connected to at least one feeding pole and the transmission line is preferably connected to an output pole or multiple transmission lines are preferably connected to a respective output pole. Preferably, an opposite polarity is provided for at least one feeding pole and for at least one transmission pole. Preferably, at least two of the poles are provided at opposed ends of the sensing element.

Preferably, the evaluation circuit comprises at least one signal amplifier, in particular a charge amplifier. The signal amplifier is preferably connected to the transmission line and thus configured to deliver a signal representative for a signal transmitted over the transmission line. According to a preferred configuration, the signal amplifier is an operational amplifier that is preferably provided with a feedback capacitor. Preferably, the evaluation circuit and the signal injector are enclosed in a common electronics unit.

Preferably, the measuring circuit is configured such that the test signal is transmittable to the evaluation circuit via the at least one transmission line solely or additionally to the respective measuring signal. Thus, the testing and/or surveillance of the measuring circuit can preferably be conducted on the one hand during a measuring operation and on the other hand independently from a measuring operation.

A preferred method for testing the measuring circuit comprises an evaluation of the test signal transmitted via the transmission line at an output of the evaluation circuit, in particular at the output of the signal amplifier. Preferably, an evaluation logic is provided in the evaluation circuit by which the evaluation of the test signal is conducted. Preferably, a failure or quality loss either of the sensing element or of the signal injector and/or injection line and/or transmission line is identified by a reduction of the evaluated test signal with respect to an expected value.

In addition, various short circuits in the measuring circuit are preferably made detectable by the evaluation of the transmitted test signal. These shortcuts may arise in particular in between conductors, in between a shielding and a conductor, across the sensing element or across the insulations inside the sensor. Furthermore, a disconnection of a connection to ground is preferably made detectable. Such a disconnection may comprise the grounding of the sensor, in particular of the sensor housing, the grounding of a shielding, or the grounding of the signal injector.

In a first preferred configuration, the above described measuring circuit is implemented as an asymmetric measuring circuit that is in particular used for testing applications. In a second preferred configuration, the measuring circuit is implemented as a symmetric measuring circuit with additional redundancy features as further described below. Such a symmetric measuring circuit is preferably applied in monitoring applications, in applications with specific safety integrity level (SIL) requirements, in applications in which the measuring circuit is mounted in locations difficult to access, or in remote locations.

In that second preferred configuration, the sensing element is configured to generate an additional measuring signal from the measuring object and the sensing circuit comprises an additional transmission line connected to the sensing element for transmitting the additional measuring signal to the evaluation circuit. This provides a redundant functionality of the measuring circuit. Besides a higher reliability of the measuring circuit, this can also contribute to a higher detectability of quality losses or failures in the measuring circuit.

Preferably, the injection line and the additional transmission line are interconnected in series via the sensing element such that the test signal is transmittable to the evaluation circuit over the transmission line and/or the additional transmission line. In this way, a series connection of the injection line with the transmission line and with the additional transmission line is preferably established via the sensing element. Thus, a transmission of the test signal via the transmission line and via the additional transmission line can redundantly be checked in the evaluation circuit. This further contributes to a higher detectability of quality losses or failures in the measuring circuit.

During regular operation of the measuring circuit, the test signal transmitted over the transmission line and the test signal transmitted over the additional transmission line are preferably provided with substantially the same amplitude. According to a preferred configuration, the test signal transmitted over the transmission line and the test signal transmitted over the additional transmission line are also provided with an identical phase.

Preferably, the injection line and the additional transmission line are separate from each other except their series connection via the sensing element. Thus, the test signal can preferably be fed into the additional transmission line only through the sensing element. Preferably, the only physical connection in between the additional transmission line and the signal injector is thus provided via the sensing element. This can contribute to an unambiguous verifiability of quality factors that are related to the sensing element. Moreover, also the transmission line and the additional transmission line are preferably separate from each other, thus allowing a respective signal transmission from the sensing element to the evaluation circuit independently from one another. In this way, various sources of failure or quality loss in the measuring circuit can be made further recognizable.

Preferably, the test signal generated from the same signal injector can be fed through the sensing element to the transmission line and the additional transmission line. More preferred, the test signal injected into the sensing element is also provided via the same injection line. In this way, the risk of an undesired discrepancy between the test signal fed to the transmission line and the test signal fed to the additional transmission line can be minimized.

For this purpose, at the end of the injection line two feeding poles are preferably provided on the sensing element such that the test signal can be fed through the sensing element in two opposite directions. Preferably, the capacitances between each feeding pole and a respective output pole connected to a transmission line are substantially equal. In a preferred configuration, the two feeding poles are provided by a common feeding electrode located inside the sensing element. The common feeding electrode is preferably provided in the middle of the sensing element.

To allow a generation of the measuring signal and the additional measuring signal, the sensing element is preferably divided into two sensing units, in particular by the common feeding electrode. The two sensing units are preferably adapted to generate a substantially corresponding measuring signal from the measuring object under the same measurement conditions. Preferably, the corresponding measuring signals are provided as a measuring signal and an additional measuring signal with substantially the same amplitude. According to a preferred configuration, the measuring signal and the additional measuring signal are provided with an opposite phase.

In the case of a piezoelectric sensing element, each sensing unit preferably comprises the same number of piezoelectric plates. Preferably, each sensing unit has a substantially equal capacitance.

Preferably, two separate output poles are provided on the sensing element for the transmission line and the additional transmission line. A respective output pole is preferably provided on each sensing unit of the sensing element. Preferably, the output poles are provided on opposed ends of the sensing element. In this way, the sensing element is preferably symmetrically connected to the transmission line and the additional transmission line.

Preferably, the evaluation circuit comprises a first signal amplifier configured to deliver a signal representative for a signal transmitted over the first transmission line, and a second signal amplifier configured to deliver a signal representative for a signal transmitted over the additional transmission line. According to a preferred configuration, each signal amplifier is an operational amplifier that is preferably provided with a respective feedback capacitor.

Preferably, the evaluation circuit comprises a summing amplifier configured to deliver a signal representative for a sum of signals transmitted over the transmission line and the additional transmission line and/or a difference amplifier configured to deliver a signal representative for a difference of signals transmitted over the transmission line and the additional transmission line. This can be exploited for an advantageous testing method of the measuring circuit, as described below.

According to a preferred configuration, the summing amplifier and/or the difference amplifier are connected to both the signal amplifier for the transmission line and the signal amplifier for the additional transmission line in order to continue the processing of the respective signals and to deliver a corresponding output signal. Furthermore, a respective output amplifier is preferably connected to the signal amplifier for the transmission line and the signal amplifier for the additional transmission line to deliver a respective output signal representative for the signal transmitted via the transmission line and the additional transmission line. Preferably, an evaluation logic is provided in the evaluation circuit for conducting an evaluation of the output signals, in particular in a method as described below.

A preferred method for testing the symmetric measuring circuit comprises an evaluation of the signals transmitted via the transmission line and the additional transmission line at a respective output of the evaluation circuit. The evaluation preferably comprises a comparison of the transmitted signals with each other and/or with an expected value. Alternatively or additionally, the difference and/or sum of the signals transmitted via the transmission line and the additional transmission line are evaluated at a respective output of the evaluation circuit. The evaluation preferably comprises a comparison of the difference and summing signal with each other and/or a comparison with an expected value.

According to a preferred configuration, a failure or quality loss is detected when the summing signal does not correspond to the twofold value of the expected transmitted test signal. A failure or quality loss is preferably also detected when the difference signal does not correspond to the twofold value of the expected transmitted measuring signal. A failure or quality loss is preferably also detected when the output signal of the transmitted signals independently does not correspond to the superposition of the expected transmitted measuring signal and the expected transmitted test signal.

Preferably, the testing of the measuring circuit can preferably be conducted during a measuring operation. In this case, the transmitted signals preferably comprise a superposition of the respective measuring signal and test signal. The testing of the measuring circuit can preferably also be conducted, when no measuring operation takes place. In this case, the transmitted signals preferably only comprise the respective test signal.

According to a preferred configuration of the testing method, the output signals obtained without measuring operation are used as comparison values for the evaluation of the output signals during a measuring operation. In particular, the summing signal of the transmitted signals obtained without measuring operation can be used as a reference value for the summing signal of the transmitted signals obtained during a measuring operation.

Possible application areas of the above described measuring circuit comprise a vibration sensor, an accelerometer, a pressure sensor, an acoustic emission sensor or similar sensing devices. In the case of a vibration sensor, the measuring object preferably comprises a rotary machine or any other vibrating structure operatively connected to the sensing element. In the case of an accelerometer, the measuring object preferably comprises a seismic mass that is mechanically coupled to the sensing element. In the case of a pressure sensor, the measuring object preferably comprises a gas and/or liquid which can for instance be operatively connected to the sensing element via a membrane. In the case of an acoustic emission sensor, the measuring object preferably comprises an emission source of acoustic waves that can be detected by the sensing element.

BRIEF DESCRIPTION OF THE DRAWINGS

The invention is explained in more detail hereinafter by means of preferred embodiments with reference to the drawings which illustrate further properties and advantages of the invention. The figures, the description, and the claims comprise numerous features in combination that one skilled in the art may also contemplate separately and use in further appropriate combinations. In the drawings:

DESCRIPTION OF PREFERRED EMBODIMENTS

Figure 1:
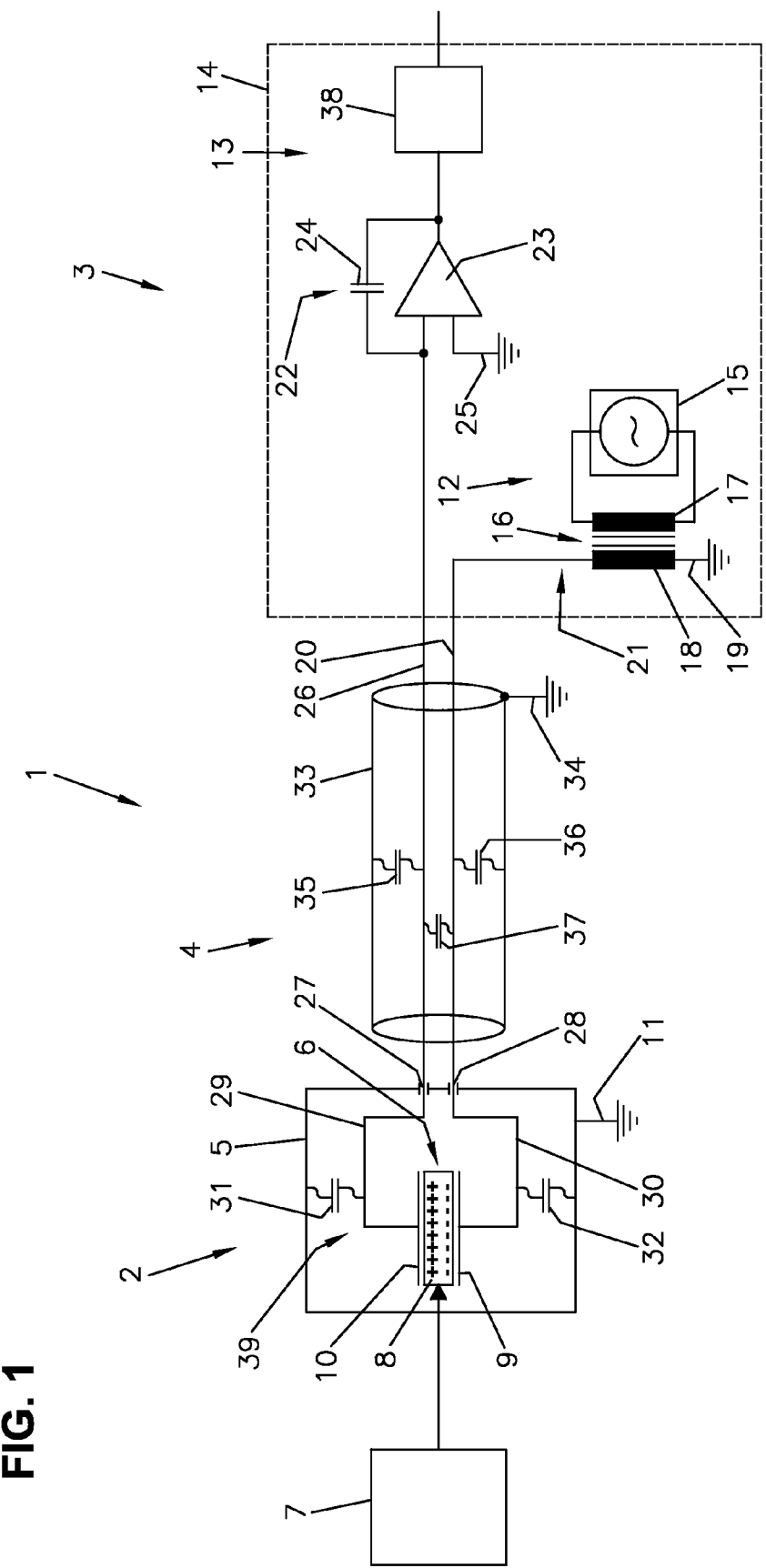
FIG. 1 is a schematic representation of a measuring circuit according to a first embodiment.

A measuring circuit 1 shown in FIG. 1 comprises a sensor 2 and an electronics unit 3. Sensor 2 and electronics unit 3 are connected by a connection cable 4. Sensor 2 comprises a housing 5 in which a sensing element 6 is arranged. Sensing element 6 is operatively connected to a measuring object 7 and configured to generate a measuring signal from measuring object 7.

Sensing element 6 comprises a stack of piezoelectric plates 8 arranged in between a first electrode 9 and a second electrode 10. The polarization direction of piezoelectric plates 8 in sensing element 6 is also indicated in FIG. 1. The first electrode constitutes a feeding pole 9 by which a test signal can be injected into sensing element 6. The second electrode constitutes an output pole 10 through which the injected test signal and/or the measuring signal can be delivered. Feeding pole 9 and output pole 10 have an inverse polarity. The value of the internal capacitance of sensing element 6 is subsequently denoted as C6. Feeding pole 9 and output pole 10 are electrically isolated from the walls of housing 5 such that sensing element 6 is arranged inside housing 5 in a electrically floating manner. Housing 5 is connected to ground 11.

Electronics unit 3 comprises a signal injector 12 and an evaluation circuit 13 arranged inside a common housing 14. Signal injector 12 comprises a signal generator 15 and a transformer 16. Transformer 16 comprises a primary winding 17 and a secondary winding 18. Primary winding 17 is connected to signal generator 15. Secondary winding 18 is connected to ground 19. Secondary winding 18 has a very small inductance. Thus, transformer 16 is adapted to transform the signal generated by signal generator 15 into a signal of very low impedance.

Secondary winding 18 of transformer 16 is also connected to an injection line 20. The other end of injection line 20 is connected to feeding pole 9. Therefore, sensing element 6 is connected to signal injector 12 and also connected to ground 19 via signal injector 12. Thus, a test signal generated by signal generator 15 can be transformed in a test signal of very low ohmic impedance by transformer 16 and transmitted to feeding pole 9 via injection line 20. In this way, a test signal injection circuit 21 comprising signal injector 12 and injection line 20 is provided. The test signal provided by signal generator 15 is an alternating current (AC). As a result, the polarity of feeding pole 9 and output pole 10 is continuously reversed. However, the polarization direction of piezoelectric plates 8 does not change.

Evaluation circuit 13 comprises a charge amplifier 22 and an evaluation logic 38. Charge amplifier 22 comprises an operational amplifier 23 with a feedback capacitor 24 and a connection to ground 25. For clarity, secondary components and associated filters are not shown. Evaluation logic 38 is connected to the output of charge amplifier 22.

The input of charge amplifier 22 is connected to output pole 10 of sensing element 6 by a transmission line 26. In this way, a sensing circuit 39 is provided comprising sensing element 6 and transmission line 26. Injection line 20 and transmission line 26 are interconnected in series via sensing element 6. Thus, a test signal injected from signal injector 12 into sensing element 6 can be fed through sensing element 6 and transmitted from output pole 10 to evaluation circuit 13 via transmission line 26. Moreover, a measuring signal generated in sensing element 6 can be transmitted from output pole 10 to evaluation circuit 13 via transmission line 26.

Transmission line 26 and injection line 20 pass through sensor housing 5 via respective output terminals 27, 28 inside the walls of housing 5. External parts of transmission line 26 and injection line 20 outside housing 5 are plugged into output terminals 27, 28. Inside housing 5, each of output terminals 27, 28 is connected to one of feeding pole 9 and output pole 10 of sensing element 6 by a respective internal wiring 29, 30. Internal wirings 29, 30 thus constitute an internal part of transmission line 26 and an internal part of injection line 20. Internal wirings 29, 30 are electrically isolated from sensor housing 5 and effectuate in between a respective capacitance 31, 32. The values of these capacitances are subsequently denoted as C31, C32.

In between sensor 2 and electronics unit 3, transmission line 26 and injection line 20 are enclosed by connection cable 4. Cable 4 comprises an outer electromagnetic shielding 33 that is common for transmission line 26 and injection line 20. Transmission line 26 and injection line 20 thus extend through common shielding 33 over a substantial part of the distance in between sensor 2 and electronics unit 3.

At one of its ends, common shielding 33 is connected to ground 34. Transmission line 26 and injection line 20 are electrically isolated from common shielding 33 and effectuate in between a respective capacitance 35, 36. The values of these capacitances are subsequently denoted as C35, C36. Moreover, a respective capacitance 37 is effectuated in between the conductors of transmission line 26 and injection line 20 inside cable 4. The value of this capacitance is subsequently denoted as C37.

Thus, measuring circuit 1 allows injecting a test signal by applying an alternative test voltage Ut through injection line 20 to one end of sensing element 6. The test voltage Ut is generated by a very low impedance signal injector 12 connected to ground 19. Consequently, a charge Qt is transmitted to and injected in the input of charge amplifier 22 through the internal capacitance C6 of sensing element 6 and in parallel with the capacitance 37 of the conductors of injection line 20 and transmission line 26. The charge Qt is given by $Qt=Ut*(C6+C37)$.

The frequency and amplitude of the test signal can be chosen freely within wide limits, preferably at a frequency outside the useful frequency band of the signal measured by sensor 2. In a normal functional state, the test signal will appear at charge amplifier 22 with the magnitude Qt as described above. If a connection at the sensor output or inside sensor 6 fails then the test signal at the charge amplifier reduces to $Qt=Ut*C37$. If the connection fails at evaluation unit 13, the resulting test signal Qt will be zero.

The capacitances 31, 32, 35 and 36 together with the internal capacitance C6 of sensing element 6 and capacitance 37 between the conductors of injection line 20 and transmission line 26 form a capacitor network. The effective capacitance seen between secondary winding 18 of transformer 16 and the input of charge amplifier 22 will determine the magnitude of Qt. The grounding 34 of shield 33 and the grounding 11 of housing 5 prevents the capacitances 31, 32, 35 and 36 from participating in the transfer function evaluated in evaluation circuit 13.

Moreover, not only the above mentioned main failures of open contacts can be detected but also the following possible short circuits: between conductors 20, 26, between either of conductors 20, 26 and shielding 33, across sensing element 6 or across insulations 31, 32 inside sensor 2. In addition, a disconnection of grounding 34 of cable 4 or of grounding 11 of sensor 2 can be detected by the proposed measuring circuit.

The addition of shielding 33 allows modifying the influence of certain groups of capacitors on the test signal as it appears at charge amplifier 22. In order to improve the immunity to electric fields and also the sensitivity of a measurement of the variation of the internal capacitance C6 of sensing element 6, different shielding concepts are possible. One or several transmission lines 26 can be shielded separately with or without the external common shielding 33.

Figure 2:
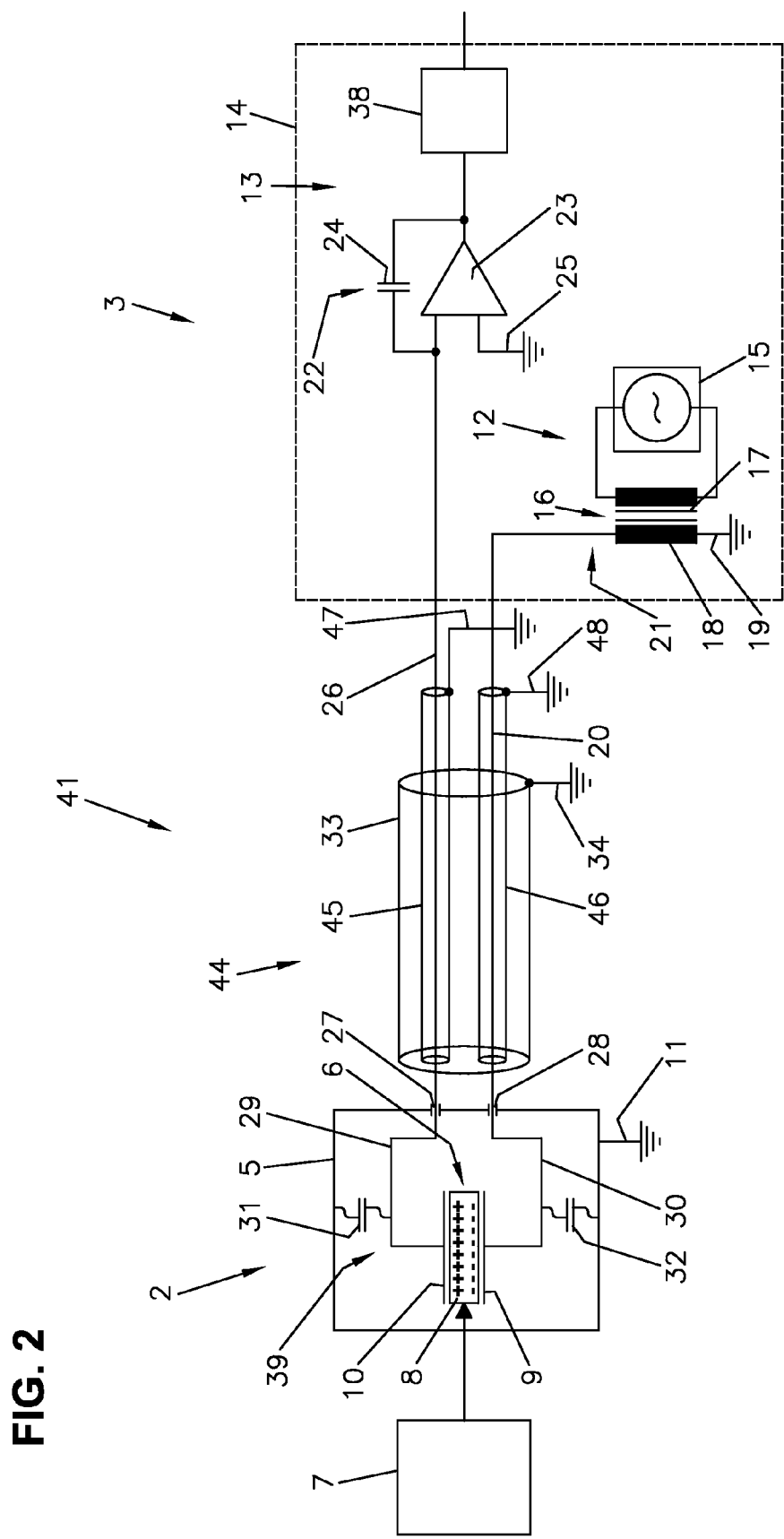
FIG. 2 is a schematic representation of a measuring circuit according to a second embodiment.

FIG. 2 shows a measuring circuit 41, in which such a different shielding concept is applied in order to improve the testing sensitivity of variations of the capacitance of the sensing element. Corresponding elements with respect to measuring circuit 1 shown in FIG. 1 are denoted with the same reference numerals.

Measuring circuit 41 comprises a connection cable 44 in between sensor 2 and electronics unit 3. Connection cable 44 comprises common shielding 33, through which transmission line 26 and injection line 20 extend. Inside common shielding 33, a separate electromagnetic shielding 45 is arranged, through which only transmission line 26 extends. Moreover, another separate electromagnetic shielding 46 is arranged inside common shielding 33, through which only injection line 20 extends. Each separate shielding 45, 46 is provided with a respective connection to ground 47, 48.

The application of separate electromagnetic shielding 45 and 46 allows to eliminate the influence of the capacitance 37 between the conductors of transmission line 26 and injection line 20. By removing the influence of the conductor capacitance C37 shown in FIG. 1, the addition of shielding 45, 46 allows to determine a variation of the capacitance value C6 of sensing element 6 even when long cables are used, in particular very small variations of the capacitance value C6. Moreover, it allows eliminating the direct injection of the test signal through cable capacitance 37 shown in FIG. 1. In measuring circuit 41 shown in FIG. 2, Qt at the charge amplifier is thus given by Qt=Ut*C6.

The invention applied to asymmetric measuring circuits as depicted in FIG. 1 and FIG. 2 is well suited for testing applications. However, in some applications a redundancy feature may be particularly desirable. Such type of applications include monitoring applications, applications with specific Safety Integrity Level (SIL) requirements, applications where the measuring circuit is mounted in locations difficult to access and remote locations. Adding a redundancy feature can be achieved by applying the present invention to an electrically symmetric measuring circuit with an additional transmission line connected to a sensing element with a dedicated test input, as shown in FIG. 3.

Figure 3:
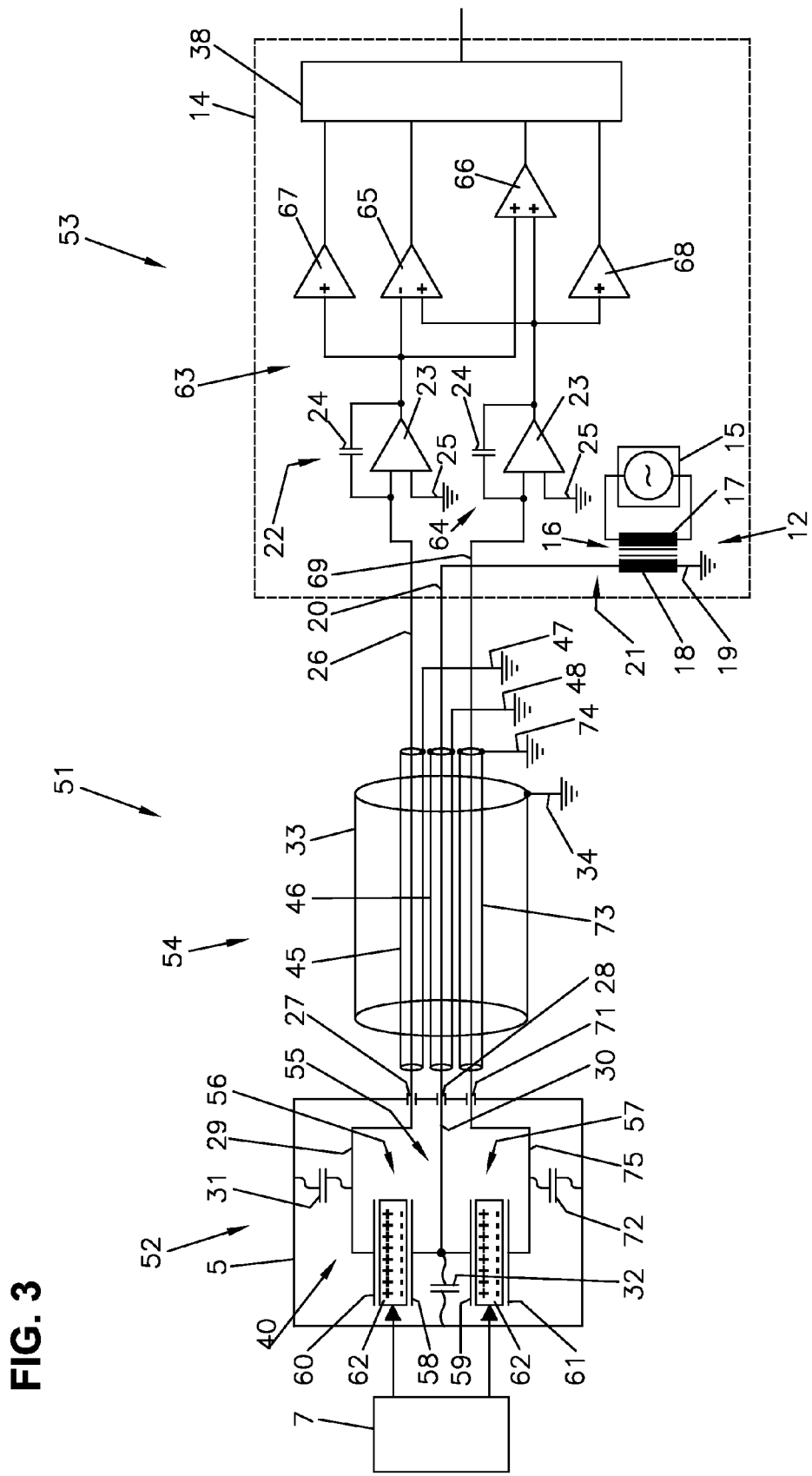
FIG. 3 is a schematic representation of a measuring circuit according to a third embodiment.

FIG. 3 shows a measuring circuit 51 comprising a sensor 52 and an electronics unit 53. Sensor 52 and electronics unit 53 are connected by a connection cable 54. Corresponding elements with respect to the measuring circuits 1 and 41 shown in FIG. 1 and FIG. 2 are denoted with the same reference numerals.

A sensing element 55 is arranged inside housing 5 of sensor 52 in an electrically floating manner. Sensing element 55 is composed of two sensing units 56 and 57. Each sensing unit 56, 57 is operationally connected to measuring object 7. In this way, a first measuring signal can be generated from one of sensing units 56, 57 and an additional second measuring signal can be generated from the other sensing unit 56, 57. Each sensing unit 56, 57 comprises a respective feeding pole 58, 59 and a respective output pole 60, 61. The value of the internal capacitance of sensing units 56 and 57 is subsequently denoted as C56 and C57, respectively. Sensing units 56 and 57 are provided with a substantially equal value of their internal capacitance C56 and C57, i.e. C56~=C57.

Sensing element 55, as schematically represented in FIG. 3, is composed of a stack of piezoelectric plates 62. In the middle of stack 62, a feeding electrode is provided, which constitutes both of feeding poles 58 and 59. At the bottom and at the top of the stack 62, a respective output electrode is arranged, which constitute output poles 60, 61.

Electronics unit 53 comprises signal injector 12 and an evaluation circuit 63 enclosed in common housing 14. Evaluation circuit 63 comprises a first charge amplifier 22 and a second charge amplifier 64. Evaluation circuit 63 further comprises a difference amplifier 65 and a summing amplifier 66, which are both connected to the outputs of first charge amplifier 22 and second charge amplifier 64. Difference amplifier 65 is configured to deliver a signal representative for a difference of the signals at the outputs of first charge amplifier 22 and second charge amplifier 64. Summing amplifier 66 is configured to deliver a signal representative for a sum of the signals at the outputs of first charge amplifier 22 and second charge amplifier 64.

Evaluation circuit 63 further comprises a first output amplifier 67 connected to the output of charge amplifier 22 and a second output amplifier 68 connected to the output of charge amplifier 64. The outputs of output amplifier 67, output amplifier 68, difference amplifier 65, and summing amplifier 66 are connected to evaluation logic 38.

Both feeding poles 58, 59 are connected to signal injector 12 via injection line 20. Output pole 60 of first sensing unit 56 is connected to the input of first charge amplifier 22 via transmission line 26. Output pole 61 of second sensing unit 57 is connected to the input of second charge amplifier 64 via a second transmission line 69 that is provided in addition to first transmission line 26. In this way, a sensing circuit 40 is provided comprising sensing element 55, first transmission line 26 and additional second transmission line 69.

Second transmission line 69 passes through sensor housing 5 via an output terminal 71 inside the walls of housing 5. Output terminal 71 is disposed next to output terminals 27, 28 of transmission line 26 and injection line 20. An external part of second transmission line 69 is plugged into output terminal 71. Inside housing 5, output terminal 71 is connected to output pole 61 of second sensing unit 57 by a respective internal wiring 75. Internal wiring 75 thus constitutes an internal part of second transmission line 69. Corresponding to internal wirings 29, 30, internal wiring 75 is also electrically isolated from sensor housing 5 and effectuates in between a respective capacitance 72. The value of capacitance 72 is subsequently denoted as C72.

In between sensor 52 and electronics unit 53, second transmission line 69, transmission line 26 and injection line 20 are enclosed by connection cable 54. Cable 54 comprises outer electromagnetic shielding 33 that is common for second transmission line 69, first transmission line 26 and injection line 20. Second transmission line 69, first transmission line 26 and injection line 20 thus extend through common shielding 33 over a substantial part of the distance in between sensor 52 and electronics unit 53.

Inside common shielding 33, a separate electromagnetic shielding 73 is arranged, through which only second transmission line 69 extends. Separate electromagnetic shielding 73 is disposed next to separate electromagnetic shielding 46 of injection line 20 and next to separate electromagnetic shielding 45 of transmission line 26. Separate shielding 73 is also provided with a respective connection to ground 74.

The application of each separate electromagnetic shielding 45, 46 and 73 inside common shielding 33 allows to eliminate the influence of a capacitance between the conductors of first transmission line 26, second transmission line 69 and injection line 20. By injecting a test signal Ut in measuring circuit 51 shown in FIG. 3, a charge $Qt_A$ is thus created at the input of first charge amplifier 22 that is given by $Qt_A$=Ut*C56. Correspondingly, a charge $Qt_B$ at the input of second charge amplifier 64 is created that is given by $Qt_B$=Ut*C57. Since the two capacitance values C56 and C57 are chosen to be equal, an equal charge Qt=$Qt_A$=$Qt_B$ is transmitted to first charge amplifier 22 and second charge amplifier 64 under regular measurement conditions.

Thus, in the symmetric measuring circuit 51 shown in FIG. 3, the test signal can be injected through sensing element 55 by common feeding electrode 58, 59 located in the middle of sensing element 55 and connected to injection line 20 surrounded by separate shielding 46. Feeding electrode 58, 59 is connected to ground 19. Shielding 46 is also connected to ground 48.

Common feeding electrode 58, 59 separates sensing element 6 shown in FIG. 1 and FIG. 2 into a sensing element 55 with two sensing units 56 and 57, each comprising respective piezoelectric elements. Sensing element 55 is symmetrically connected to one end of first transmission line 26 and to one end of second transmission line 69, which are also separately shielded.

At the opposite end, the conductor of first transmission line 26 is connected to charge amplifier 22 comprising operational amplifier 23 with feedback capacitor 24. Similarly, the conductor of second transmission line 69 is connected to charge amplifier 64 also consisting of a corresponding operational amplifier 23 with feedback capacitor 24. Feedback capacitors 24 of both charge amplifiers 22, 64 have an identical capacitance value Cf. The outputs of charge amplifiers 22 and 64 are connected to a difference amplifier 65 and a summing amplifier 66.

The two sensing units 56, 57 comprise piezoelectric members 62—a member 62 being for example a stack of multiple piezoelectric discs. The two sensing units 56, 57 are located on both sides of common feeding electrode 58, 59 and have equal capacitances C56 and C57 in order to allow common modes rejection.

Measuring circuit 51 is preferably used as a piezoelectric vibration sensor or a piezoelectric accelerometer. It can also be applied, for instance, as a pressure sensor, an acoustic emission sensor or any other piezoelectric sensor.

In case of a piezoelectric accelerometer, for instance, sensing units 56 and 57 deliver respective charges $Q_A$ and $Q_B$ for a given acceleration of measuring object 7. $Q_A$ and $Q_B$ have same magnitude but opposite polarity ($Q_A=-Q_B$). $Q_A$ and $Q_B$ are transmitted to and injected in the inputs of charge amplifiers 22 and 64, respectively. The outputs of charge amplifiers 22 and 64 are voltages $U_A$ and $U_B$, respectively. $U_A$ and $U_B$ are given by:

$$U_A=-Q_A/C_f \text{ and } U_B=-Q_B/C_f$$

The minus sign in each equation is due to the transfer function of each charge amplifier. With $Q_A=-Q_B$ it follows that:

$$U_A=-Q_A/C_f=-[(-Q_B)]/C_f=Q_B/C_f=-U_B$$

$U_A$ and $U_B$ have same amplitude but opposite phase ($U_A=-U_B$).

In order to perform a health check of the sensor and transmission line, an alternating current (AC) test signal Ut (the test signal could be a direct current (DC) signal) is injected through sensing element 55 by common electrode 58, 59. Consequently, piezoelectric elements 62 deliver charges $Qt_A$ and $Qt_B$, respectively. $Qt_A$ and $Qt_B$ have same magnitude and same polarity ($Qt_A=Qt_B$). $Qt_A$ and $Qt_B$ are given by:

$$Qt_A=Ut*C56, \text{ and } Qt_B=Ut*C57$$

$Qt_A$ and $Qt_B$ are transmitted to and injected in the inputs of charge amplifiers 22 and 64, respectively. Consequently the outputs of charge amplifiers 22 and 64 are voltages $Ut_A$ and $Ut_B$, respectively. $Ut_A$ and $Ut_B$ are given by:

$$Ut_A=-Qt_A/C_f \text{ and } Ut_B=-Qt_B/C_f$$

The minus sign in each equation is due to the transfer function of each charge amplifier. With $Qt_A=Qt_B$ it follows that:

$$Ut_A=-Qt_A/C_f=-Qt_B/C_f=Ut_B$$

$Ut_A$ and $Ut_B$ have same amplitude and same phase ($Ut_A=Ut_B$).

Considering now the superposition of both the measuring signal and test signal, it follows that under normal conditions, the output of difference amplifier 65 is given by:

$$U_{out65}U_A+Ut_A-(U_B+Ut_B)=U_A-U_B+Ut_A-Ut_B$$

With $U_A=U_B$ and $Ut_A=Ut_B$ it follows that:

$$U_{out65}=2U_A=-2U_B \quad (I)$$

Similarly, under normal conditions, the output of summing amplifier 66 is given by:

$$U_{out66}=U_A+Ut_A+(U_B+Ut_B)=U_A+U_B+Ut_A+Ut_B$$

With $U_A=-U_B$ and $Ut_A=Ut_B$ it follows that:

$$U_{out66}=2Ut_A=2Ut_B \quad (II)$$

In addition to difference amplifier 65 and summing amplifier 66, the two additional output amplifiers 67 and 68 are provided to deliver signals which correspond to the outputs of charge amplifiers 22 and 64, respectively. The outputs of amplifiers 67 and 68 are given by:

$$U_{out67}=U_A+Ut_A \quad (III)$$

$$U_{out68}=U_B+Ut_B \quad (IV)$$

The signals according to equations (I) to (IV) are then evaluated in evaluation logic 38.

Evaluation of These Signals Allows:

a) detecting and localizing a fault either in the sensing element, connection or transmission line, and b) selecting the path (either A or B) remaining functional therefore providing circuit redundancy.

The above described measuring circuit 1, 41, 51 represents a further development of the measuring circuit disclosed in U.S. Pat. No. 6,498,501 B2, which is herewith included by reference, and can comprise any other components and/or configurations and/or applications disclosed therein.

From the foregoing description, numerous modifications of the measuring circuit according to the invention are apparent to one skilled in the art without leaving the scope of protection of the invention that is solely defined by the claims.

The invention claimed is:

1. A measuring circuit comprising
   an evaluation circuit;
   a sensing circuit comprising a sensing element configured to generate a measuring signal from a measuring object and a transmission line for transmitting the measuring signal to the evaluation circuit; and
   a test signal injection circuit comprising a signal injector and an injection line connecting a signal output of the signal injector with the sensing circuit for feeding a test signal into the sensing circuit such that the test signal is transmittable to the evaluation circuit over the transmission line;
   wherein the injection line and the transmission line are interconnected in series via the sensing element such that said test signal can be fed to the evaluation circuit through the sensing element, wherein the injection line and the transmission line are separate from each other except for said series connection via the sensing element,
   wherein the sensing element comprises at least one feeding pole for injecting the test signal and at least one output pole for delivering at least one of the measuring signal and the test signal; the injection line is connected to at least one said feeding pole to which the transmission line is not directly connected; and the transmission line is connected to at least one said output pole to which the injection line is not directly connected.

2. The measuring circuit according to claim 1, wherein the signal injector is connected to ground.

3. The measuring circuit according to claim 1, wherein the signal output of the signal injector has an ohmic impedance value of at most 10 Ω.

4. The measuring circuit according to claim 1, wherein the signal injector comprises a transformer to match an impedance value of the signal output of the signal injector to a desired value.

5. The measuring circuit according to claim 1, wherein the injection line and the transmission line extend through a common electromagnetic shielding.

6. The measuring circuit according to claim 5, wherein a separate electromagnetic shielding for the injection line and/or the transmission line is provided, in particular inside the common electromagnetic shielding.

7. The measuring circuit according to claim 1, wherein the sensing element is configured to generate an additional measuring signal from the measuring object and the sensing circuit comprises an additional transmission line connected to the sensing element for transmitting the additional measuring signal to the evaluation circuit.

8. The measuring circuit according to claim 7, wherein the injection line and the additional transmission line are interconnected in series via the sensing element such that the test signal is transmittable to the evaluation circuit over the additional transmission line.

9. The measuring circuit according to claim 8, wherein at the end of the injection line two feeding poles are provided on the sensing element such that the test signal can be fed through the sensing element in two opposite directions.

10. The measuring circuit according to claim 9, wherein the two feeding poles are provided by a common electrode located inside the sensing element.

11. The measuring circuit according to claim 9, wherein at the feeding poles the sensing element is divided into two sensing units having a substantially equal capacitance.

12. The measuring circuit according to claim 7, wherein for the transmission line and the additional transmission line a separate output pole is provided on the sensing element.

13. The measuring circuit according to claim 12, wherein the output poles are provided on opposed ends of the sensing element.

14. The measuring circuit according to claim 1, wherein the sensing element is a piezoelectric sensing element.

15. The measuring circuit according to claim 7, wherein the evaluation circuit comprises a first signal amplifier configured to deliver a signal representative for a signal transmitted over the transmission line, and a second signal amplifier configured to deliver a signal representative for a signal transmitted over the additional transmission line.

16. The measuring circuit according to claim 7, wherein the evaluation circuit comprises a summing amplifier configured to deliver a signal representative for a sum of signals transmitted over the transmission line and the additional transmission line and/or a difference amplifier configured to deliver a signal representative for a difference of signals transmitted over the transmission line and the additional transmission line.

17. The measuring circuit according to claim 1, wherein the signal output of the signal injector has an ohmic impedance value of at most 0.5 Ω.

\* \* \* \* \*